United States Patent
Ohashi

[19]

[11] Patent Number: 5,880,621
[45] Date of Patent: Mar. 9, 1999

[54] ANALOG SWITCH CIRCUIT

[75] Inventor: Ikuo Ohashi, Tokyo, Japan

[73] Assignee: NEC Corporation, Tokyo, Japan

[21] Appl. No.: 904,341

[22] Filed: Jul. 31, 1997

[30] Foreign Application Priority Data

Jul. 31, 1996 [JP] Japan .................................. 8-201703

[51] Int. Cl.⁶ .................................................. H03K 3/01
[52] U.S. Cl. ........................ 327/534; 326/113; 327/314; 327/379
[58] Field of Search ............................ 326/113; 327/530, 327/534, 309, 310, 313, 314, 379

[56] References Cited

U.S. PATENT DOCUMENTS

| 5,132,577 | 7/1992 | Ward | 307/570 |
| 5,579,200 | 11/1996 | Rajkanan et al. | 361/111 |

FOREIGN PATENT DOCUMENTS

| 58-68319 | 4/1983 | Japan . |
| 63-144620 | 6/1988 | Japan . |
| 1-236731 | 9/1989 | Japan . |

Primary Examiner—Timothy P. Callahan
Assistant Examiner—Jeffrey Zweizig
Attorney, Agent, or Firm—Sughrue, Mion, Zinn, Macpeak & Seas, PLLC

[57] ABSTRACT

Disclosed is an analog switch circuit which has: an analog switch which is composed of a P-channel first transistor and a N-channel second transistor whose drains are connected to each other and whose sources are connected to each other; first and second diodes which are in parallel and reversely to each other connected between a back gate of the first transistor and a high-potential power source; and third and fourth diodes which are in parallel and reversely to each other connected between a back gate of the second transistor and a low-potential power source. Further disclosed is an analog switch circuit which has: an analog switch which is composed of a P-channel first transistor and a N-channel second transistor whose drains are connected to each other and whose sources are connected to each other; and a N-channel third transistor whose gate is connected to a high-potential power source and/or a P-channel fourth transistor whose gate is connected to a low-potential power source; wherein the third transistor and/or the fourth transistor are/is in series connected between an input terminal and an input terminal of the analog switch.

4 Claims, 10 Drawing Sheets

FIG.3A PRIOR ART 52, 53 : DIODES WITH LOW FORWARD VOLTAGE DROP

1, 2, 29~34 : ELECTROSTATIC PROTECTING DIODE
3, 28 : ANALOG SWITCH
17 : COMPARATOR

ANALOG SWITCH CIRCUIT

FIELD OF THE INVENTION

This invention relates to an analog switch circuit, and more particularly to, an analog switch circuit which is mounted on a semiconductor integrated circuit and used to turn on or off an analog signal.

BACKGROUND OF THE INVENTION

Figure 1A:
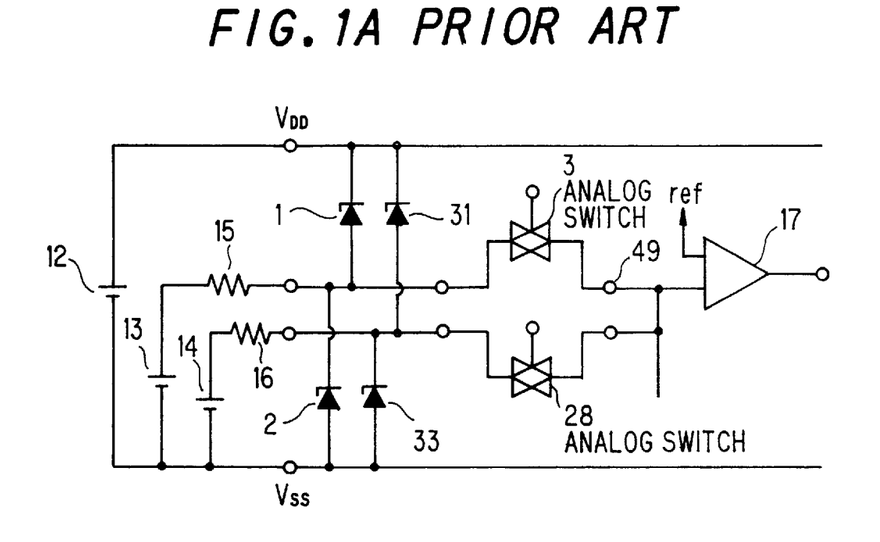
FIGS. 1A and 1B are circuit diagrams showing a conventional analog switch circuit.

As a conventional analog switch circuit, for example, an analog switch circuit, which is used in an input device as shown in FIG. 1A, is known. This input device comprises a power source 12, input signal sources 13, 14, current limiting resistance 15, 16, electrostatic protecting diodes 1, 2, 31, 33, analog switches 3, 28, and a comparator 17.

Figure 1B:
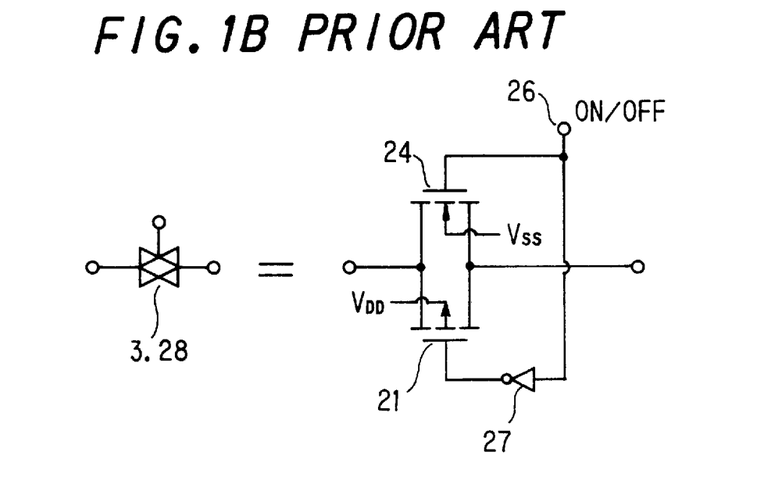

The analog switches 3, 28, as shown in FIG. 1B, comprise a P-channel transistor 21 and a N-channel transistor 24 whose drains and sources are connected to each other, and an inverter 27 which inverts a signal from a terminal 26 and then applies it to the gate of the P-channel transistor 21.

Figure 2A:
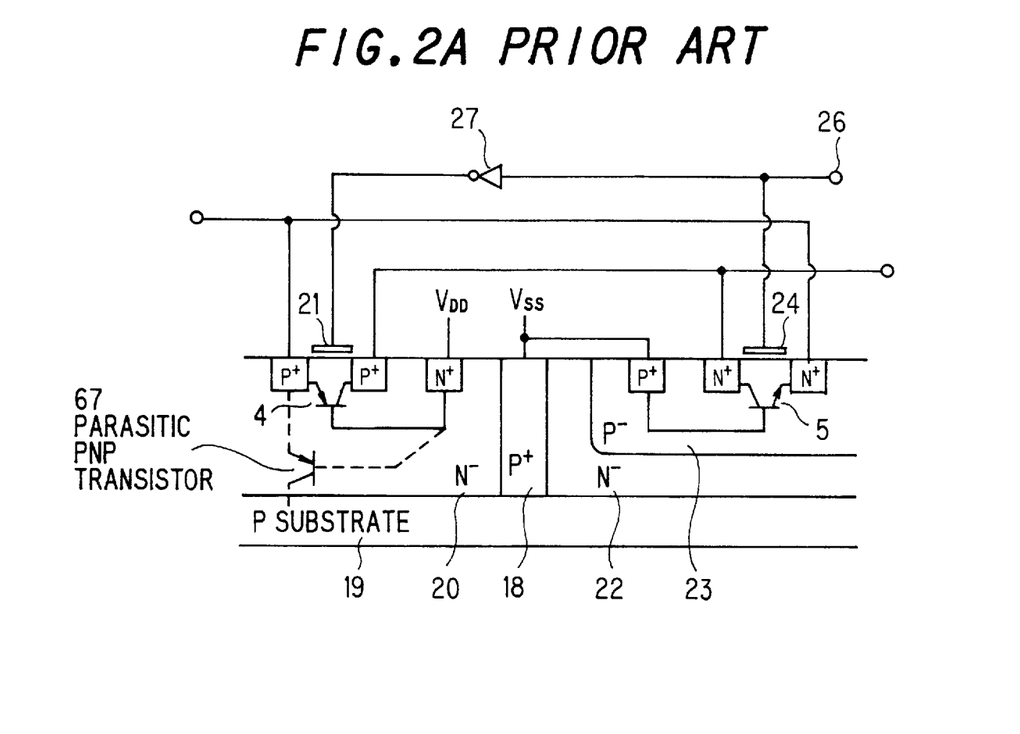
FIG. 2A is a cross sectional view showing the analog switch circuit in FIG. 1A

As shown in FIG. 2A, the analog switches 3, 28 are so fabricated that N⁻ layers 20, 22 separated by a P⁺ separating layer 18 for preventing from latching up are formed on a P-substrate 19 and the gate electrodes of the P-channel transistor 21 in the N⁻ layer 20 and the N-channel transistor 24 in the P-layer 23 formed in the N⁻ layer 22 are connected to each other through the inverter 27.

Figure 2B:
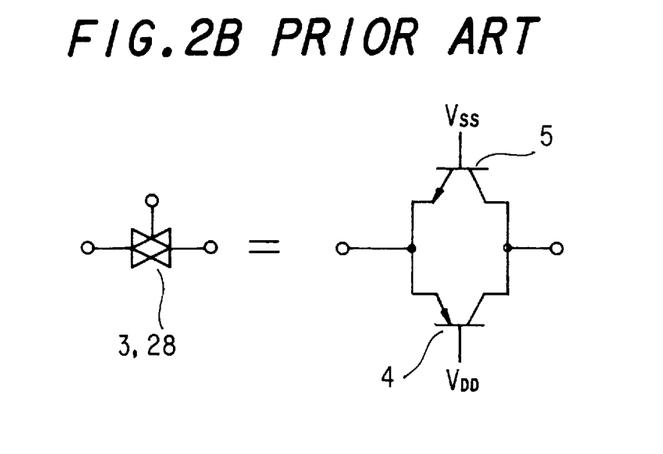
FIG. 2B is a circuit diagram showing the analog switch in FIG. 1A represented by parasitic transistors.

Hereupon, the source, drain and back gate of the P-channel transistor 21 correspond to the emitter, collector and base, respectively, of a PNP transistor 4, where the back gate, i.e., the base is connected to a power source potential $V_{DD}$. Also, the drain, source and back gate of the N-channel transistor 24 correspond to the emitter, collector and base, respectively, of a NPN transistor 5, where the back gate, i.e., the base is connected to a ground potential $V_{SS}$. Thus, the analog switches 3, 28 have the PNP transistor 4 and NPN transistor 5 as parasitic transistors. Therefore, they can be, as shown in FIG. 2B, represented by the PNP transistor 4 and NPN transistor 5 whose emitters and collectors are connected to each other.

The operation of this analog switch circuit will be explained below. First, taking the case that the potentials of the input signal sources 13, 14 lie between the power source potential $V_{DD}$ and the ground potential $V_{ss}$, when the analog switch 3 is OFF and the analog switch 28 is ON, the potential of the input signal source 14 is, as it is, applied to the input terminal of the comparator 17, and its level is compared to a reference potential 'ref', and then the comparison result is output.

Next, taking the case that the potential of the input signal source 13 is higher than the power source potential $V_{DD}$ and the potential of the input signal source lies between the power source potential $V_{DD}$ and the ground potential $V_{SS}$, when the analog switch 3 is OFF and the analog switch 28 is ON, the current flows through the current limiting resistance 15, electrostatic protecting diode 1 into the power source 12. However, as seen from FIG. 2A, the emitter, base of the parasitic PNP transistor 4 are connected parallel to the electrostatic protecting diode 1. Therefore, the current flows into the base of the PNP transistor 4, and the PNP transistor 4 is turned on.

As a result, the current flows from the input signal source 13 through the current limiting resistance 15, PNP transistor 4, the output terminal 49 of the analog switch 3, analog switch 28 and current limiting resistance 16 into the input signal source 14. Thereby, the input potential of the comparator 17 becomes higher than the potential of the input signal source 14. This may cause a failure in the output of correct comparison data from the comparator 17.

Figure 3A:
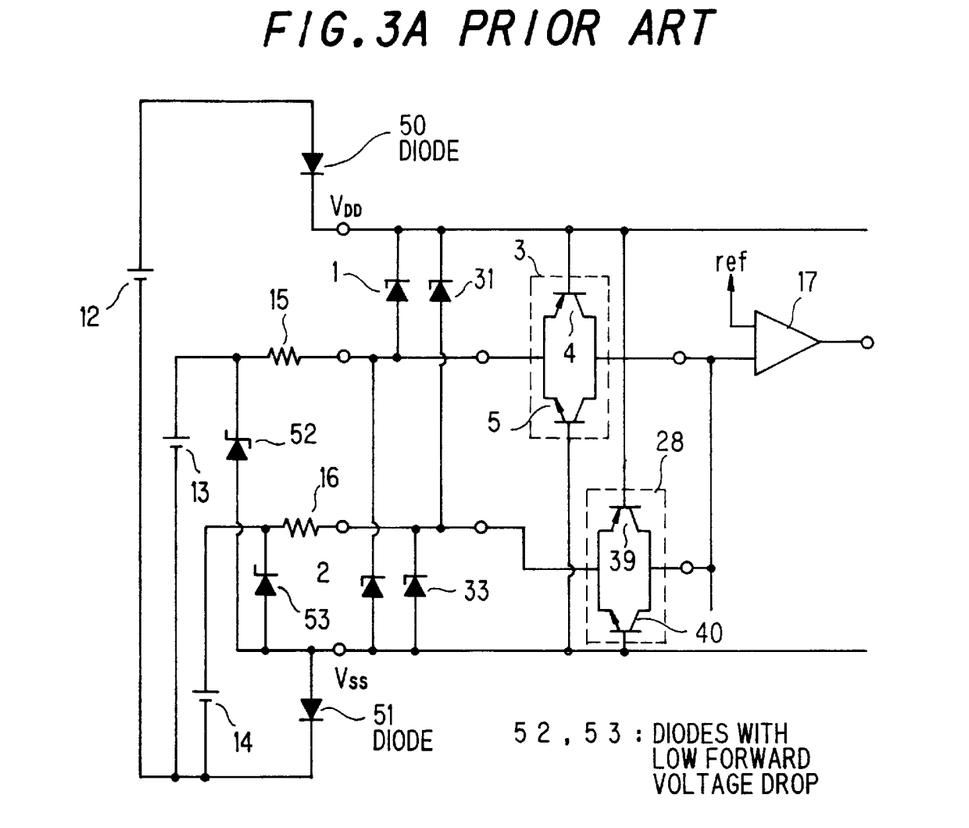
FIG. 3A is a circuit diagram showing another conventional analog switch circuit.

To suppress such a phenomenon, Japanese patent application laid-open No.58-68319(1983) discloses an analog switch circuit. In this circuit, diodes 50, 51 are connected between a power source potential $V_{DD}$ and a ground potential $V_{SS}$ of the integrated circuit and a power source 12, and diodes 52, 52 with a low forward voltage drop such as a Schottky barrier diode are connected between input signal sources 13, 14 and a ground potential $V_{SS}$. Thereby, even when the voltage of the power source 12 is not supplied and the voltages of the input signal sources 13, 14 are supplied, the analog switches 3, 28 can be kept to be turned off.

In this analog switch circuit, the current flowing from the input signal source 13 through the current limiting resistance 15, the emitter and base of the PNP transistor 4 into the power source 12 is blocked by the diode 50. Also, in the potential relation, when the input signal source 14 is higher than the power source(positive potential) and the input signal source 13 is lower than the power source 12(negative potential), the current path is formed from the input signal source 14 through the current limiting resistance 16, the emitter and base of a parasitic PNP transistor 39(or an electrostatic protecting diode 31), the power source $V_{DD}$ of IC, a control circuit(not shown) or a leakage in IC, the ground potential $V_{SS}$ of IC, the base and emitter of the parasitic NPN transistor 5 and the current limiting resistance 15 to the input signal source 13.

Figure 3B:
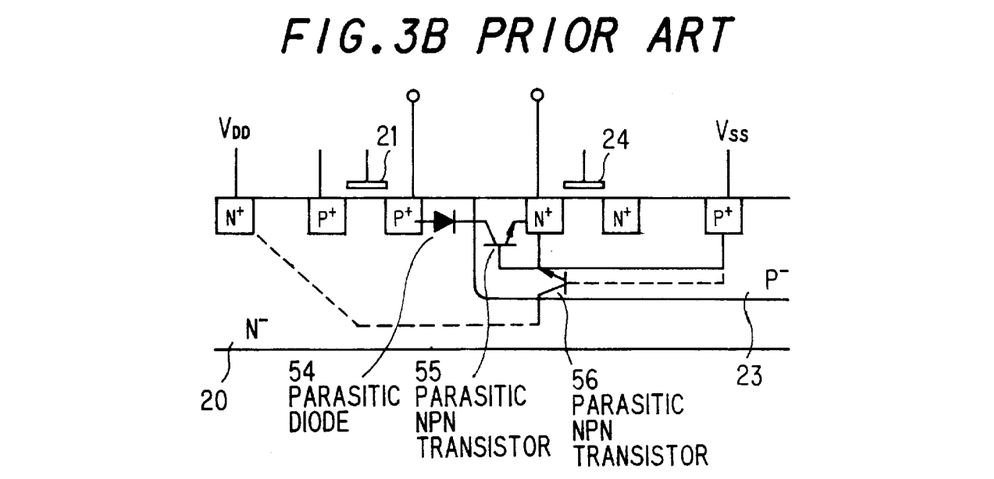
FIG. 3B is a cross sectional view showing the analog switch circuit in FIG. 3A.

In this case, as shown in 3B, a parasitic diode 54 and a parasitic NPN transistor 55 can be turned on by the leakage current flowing into a parasitic NPN transistor 56 to flow the current therethrough. However, bypassing the current by the diodes 52, 53 with a low forward voltage drop, the parasitic diode 54 and the parasitic NPN transistor 55 can be kept to be off to prevent the current from flowing.

Figure 4:
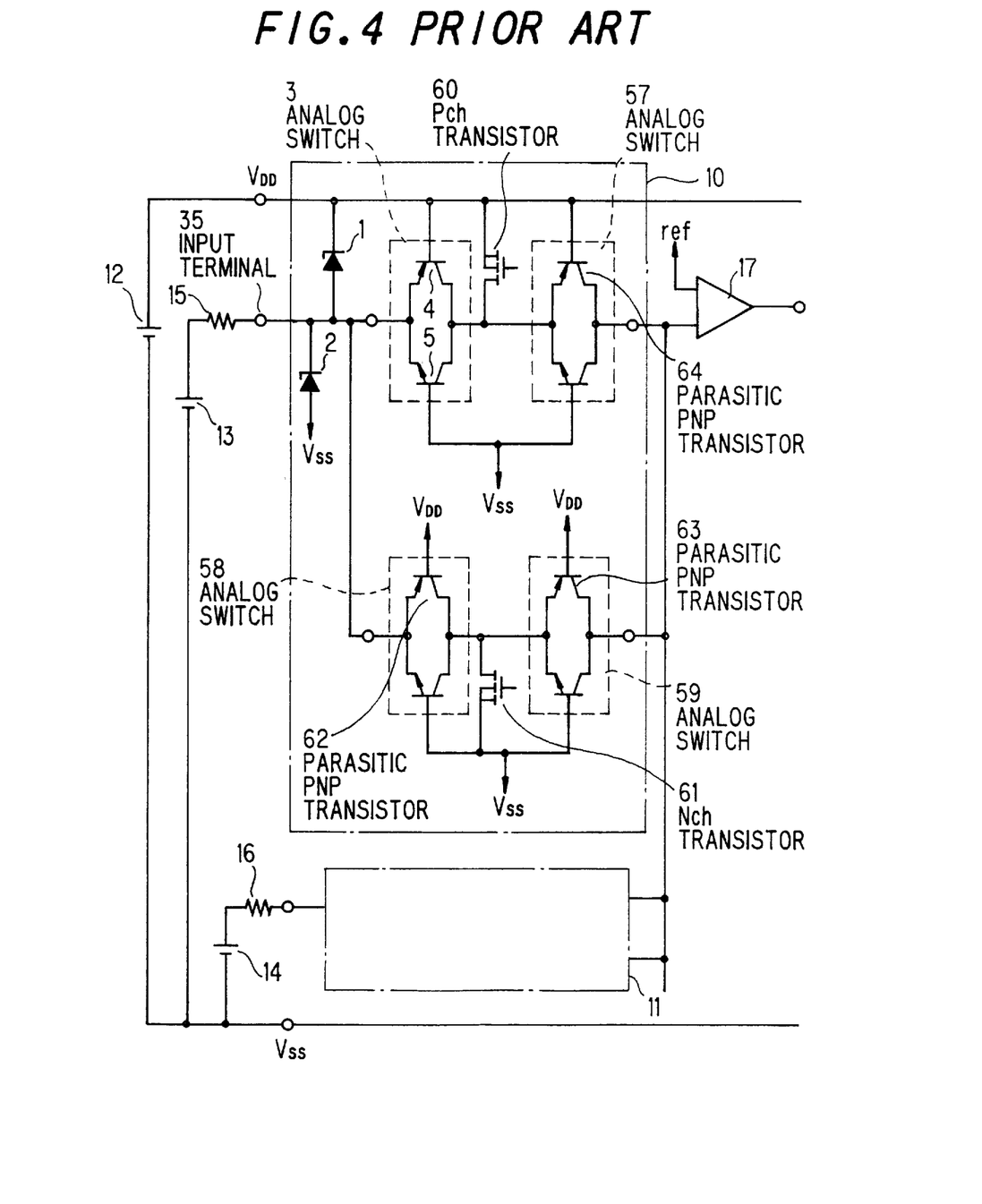
FIG. 4 is a circuit diagram showing a further conventional analog switch circuit.

On the other hand, Japanese patent application laid-open No.63-144620(1988) discloses another type of an analog switch circuit as shown in FIG. 4. As shown in FIG. 4, a P-channel transistor 60 is connected between analog switches 3, 57 and between them and a power source potential $V_{DD}$ a N-channel transistor 61 is connected between analog switches 58, 59 and a ground potential $V_{SS}$, and the terminals of the analog switch 3, 58 are connected through the current limiting resistance 15 to the input signal source 13.

In this circuit, when the analog switches 3, 57, 58 and 59 are individually OFF, the P-channel transistor 60 and the N-channel transistor 61 are turned on. Thus, when the potential of the input signal source 13 is higher than the potential $V_{DD}$ of the power source 12, a parasitic PNP transistor 62 in the analog switch 58 can operate, but, keeping the input potential of the following analog switch 59 less than the power source potential $V_{DD}$ by turning on the N-channel transistor 61 can prevent a parasitic PNP transistor 63 in the analog switch 59 from operating.

Also, in this circuit, by flowing the current by the operation of the parasitic PNP transistor 62 through the N-channel transistor 61 which is turned on into the ground potential $V_{SS}$, the voltage of an input terminal 35 is lowered as much as possible, and, by decreasing the base current of the parasitic PNP transistor 4 in the analog switch 3 as much as possible, the collector current of the PNP transistor 4 is decreased, and, further, by turning on the P-channel transistor 60, the emitter-base of the parasitic PNP transistor 64 in the following analog switch 57 is short-circuited. Thereby, the operation of the parasitic PNP transistor 64 can be prevented.

Figure 5:
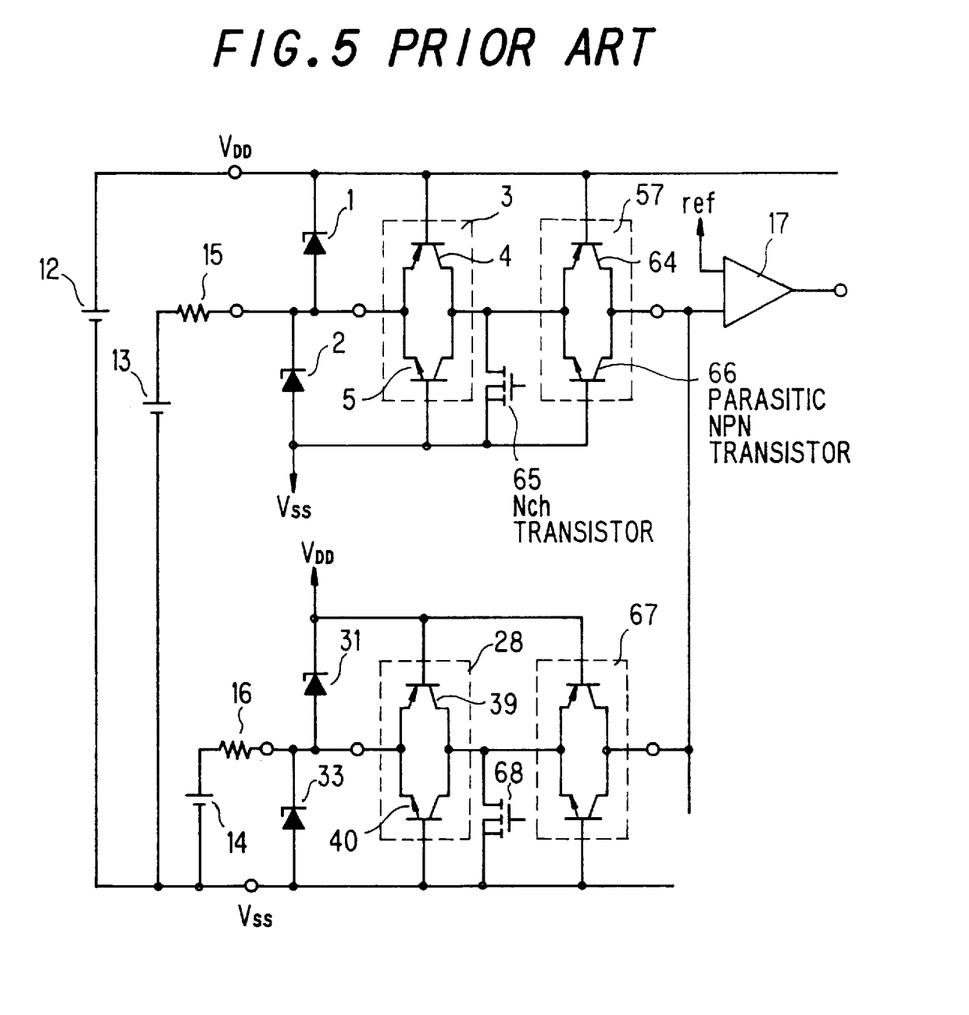
FIG. 5 is a circuit diagram showing a still further conventional analog switch circuit.

Furthermore, Japanese patent application laid-open No.1-236731(1989) discloses another type of an analog switch circuit as shown in FIG. 5. As shown in FIG. 5, a N-channel transistor(or P-channel transistor) 65 is connected between cascade-connected analog switches 3, 57 and between them and a ground potential $V_{DD}$(or a power source potential $V_{DD}$), the input terminal of the analog switch 3 is connected through a current limiting resistance 15 to an input signal source 13, a N-channel transistor(or P-channel transistor) 68 is connected between cascade-connected analog switches 28, 67 and between them and the ground potential $V_{SS}$(or the power source potential $V_{DD}$), and the input terminal of the analog switch 28 is connected through a current limiting resistance 16 to an input signal source 14. Though Japanese patent application laid-open No.1-236731(1989) describes the case that the analog switch is turned on due to the relation between the back gate potential and the gate potential, the case that the analog switch is turned on due to the operation of the parasitic transistor is taken herein.

In this analog switch circuit, when the analog switches 3, 57(28, 67) are OFF, the N-channel transistor 65(68) is turned on. Thus, when the potential of the input signal source 13 is higher than the potential $V_{DD}$ of a power source 12, a parasitic PNP transistor 4 in the analog switch 3 can operate, but, keeping the input potential of the following analog switch 57 less than the power source potential $V_{DD}$ by turning on the N-channel transistor 65 can prevent a parasitic PNP transistor 64 in the analog switch 57 from operating.

When the potential of the input signal source 13 is lower than the ground potential $V_{SS}$, a NPN transistor 5 in the analog switch 3 can operate, but, short-circuiting the base-emitter of a parasitic NPN transistor 66 in the following analog switch 57 by turning on the N-channel transistor 65 can prevent the parasitic NPN transistor 66 from operating.

However, in the conventional analog switch circuits, there is a problem that they need a number of elements. Though the analog switch circuit in FIG. 1A needs 6×n elements(the P-channel transistor, N-channel transistor and inverter composing the analog switch in the signal path, and the two electrostatic protecting diodes) to n inputs, the number of the elements is not so many.

On the contrary, the analog switch circuit in FIG. 3A needs (7×n+2) elements to n inputs. Also, the analog switch circuit in FIG. 4 needs 14×n elements to n inputs since one inverter is, which is not shown in FIG. 4, provided in the switching control signal path of four analog switches to one input. The analog switch circuit in FIG. 5 needs 9×n elements to n inputs since one inverter is, which is not shown in FIG. 5, provided in the switching control signal path of two analog switches to one input.

Also, in the conventional analog switch circuits, there is a problem that they need the current limiting resistances 15, 16 which may heat due to the operation of the parasitic transistor. The reason is that, though the current limiting resistances 15, 16 are necessary since excess current may flow due to the insertion of the diodes 1, 2 between the input terminal and the power source potential $V_{DD}$ and ground potential $V_{SS}$, in case of the structure in FIG. 2A, the parasitic PNP transistor 67 generated among the P+ region, N− layer 20 and P substrate 19 may operate due to the current flowing from the P+ region to the power source potential $V_{DD}$ when the potential of the input signal source 13 is higher than that of the power source 12, or, in case of the structure in FIG. 3B, the parasitic NPN transistor 56 generated among the N− layer 20, P− layer 23 and N+ region may operate due to the current flowing from the ground potential $V_{SS}$ to the N+ region when the potential of the input signal source 13 is lower than the ground potential $V_{SS}$. Therefore, depending on the current limiting resistance and the current amplification factor of the parasitic PNP transistor 67 or the parasitic NPN transistor 56, they may heat or be broken in the worst case. Even when the parasitic current does not cause the heating, it may cause a variation in the potential of the back gate of MOSFET, therefore undesirably affecting the high-precision IC.

SUMMARY OF THE INVENTION

Accordingly, it is an object of the invention to provide an analog switch circuit where the number of elements can be reduced as well as preventing a variation in the potential of a power source.

It is a further object of the invention to provide an analog switch circuit where the parasitic transistor can not be operated.

According to the invention, an analog switch circuit, comprises:

an analog switch which is composed of a P-channel first transistor and a N-channel second transistor whose drains are connected to each other and whose sources are connected to each other;

first and second diodes which are in parallel and reversely to each other connected between a back gate of the first transistor and a high-potential power source; and third and fourth diodes which are in parallel and reversely to each other connected between a back gate of the second transistor and a low-potential power source.

According to another aspect of the invention, an analog switch circuit, comprises:

an analog switch which is composed of a P-channel first transistor and a N-channel second transistor whose drains are connected to each other and whose sources are connected to each other; and a N-channel third transistor whose gate is connected to a high-potential power source and/or a P-channel fourth transistor whose gate is connected to a low-potential power source;

wherein the third transistor and/or the fourth transistor are/is in series connected between an input terminal and an input terminal of the analog switch.

BRIEF DESCRIPTION OF THE DRAWINGS

The invention will be explained in more detail in conjunction with the appended drawings, wherein.

DESCRIPTION OF THE PREFERRED EMBODIMENTS

An analog switch circuit in the first preferred embodiment will be explained in FIG. 6, wherein like parts are indicated by like reference numerals as used in FIGS. 1 to 5.

Figure 6:
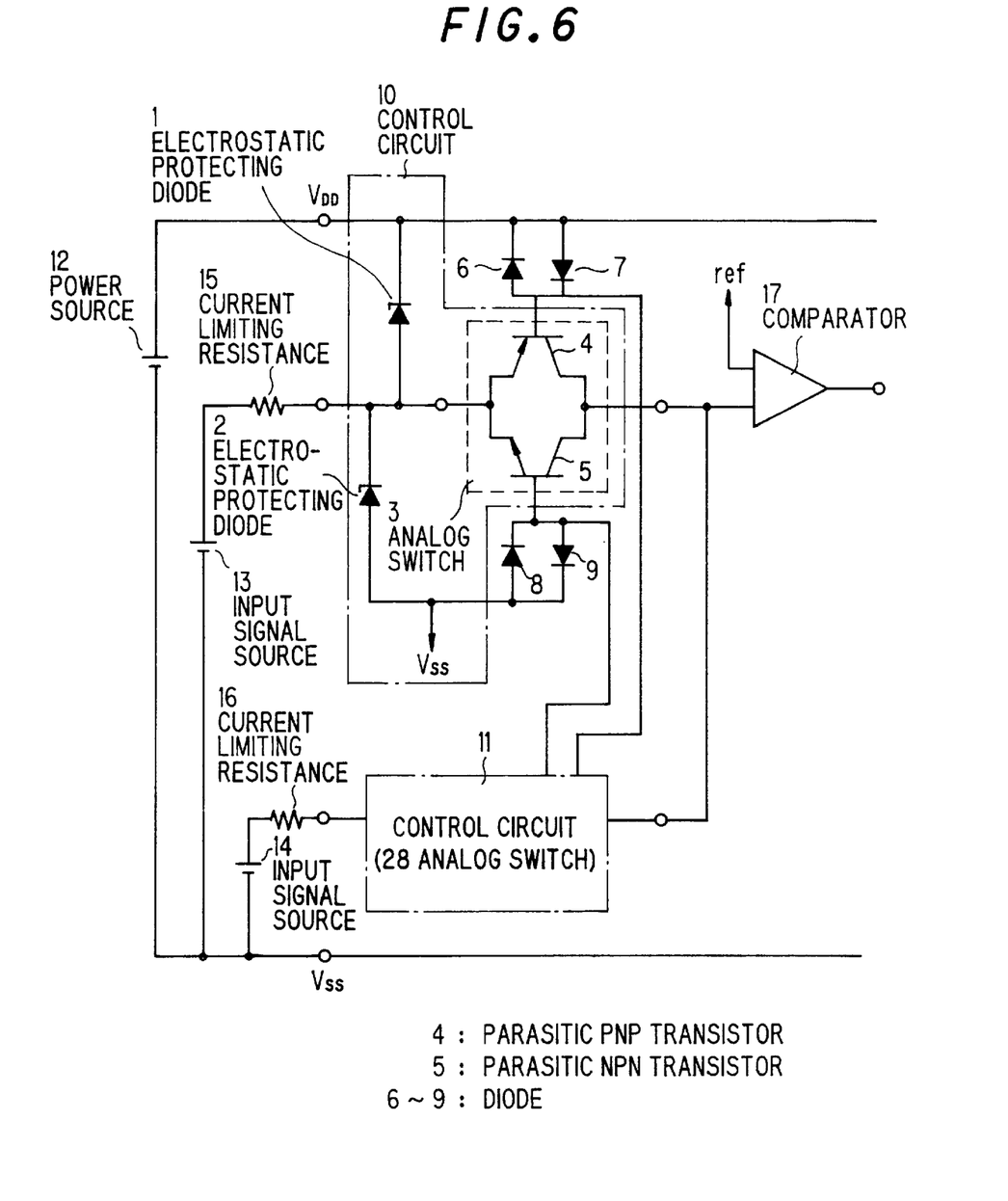
FIG. 6 is a circuit diagram showing an analog switch circuit in a first embodiment according to the invention.

As shown in FIG. 6, the analog switch circuit in the first embodiment, which is an example of two inputs, comprises a power source 12, input signal sources 13, 14, current limiting resistances 15, 16, control circuits 10, 11, a comparator 17 and diodes 6, 7, 8 and 9. The control circuits 10, 11, which serve to control whether or not the voltage(input signal) of the input signal sources 13, 14 is sent to the comparator 17, have the same circuit composition. Therefore, taking the case of the control circuit 10, the control circuit 10 comprises electrostatic protecting diodes 1, 2 and an analog switch 3. To the comparator 17, only the input signal through the control circuit 10 or 11 is input.

The analog switch 3, as explained in FIGS. 1A and 2A, comprises a P-channel transistor 21 and a N-channel transistor 24 whose drains and sources are connected to each other, an inverter 27 which inverts a signal from a terminal 26 and then applies it to the gate of the P-channel transistor 21, and has a parasitic PNP transistor 4 and a parasitic NPN transistor 5. To a current limiting resistance 15 and the connection point of the analog switch 3, the anode of the electrostatic protecting diode 1 and the cathode of the electrostatic protecting diode 2 are connected. Also, the cathode of the electrostatic protecting diode 1 is connected to the power source potential $V_{DD}$ and the anode of the electrostatic protecting diode 2 is connected to the ground potential $V_{SS}$ of the lower potential power source.

Furthermore, diodes 6, 7 whose directions are reverse to each other are in parallel connected between the base of the parasitic PNP transistor 4 and the power source potential $V_{DD}$. Also, diodes 8, 9 whose directions are reverse to each other are in parallel connected between the base of the parasitic NPN transistor 5 and the ground potential $v_{SS}$. The diodes 6 to 9 are commonly provided in the control circuits 10, 11, i.e., regardless of the number of input signals. Thus, in the analog switch 28 of the control circuit 11, diodes 6, 7 whose directions are reverse to each other are in parallel connected between the base of a parasitic PNP transistor 39 and the power source potential $V_{DD}$, and diodes 8, 9 whose directions are reverse to each other are in parallel connected between the base of a parasitic NPN transistor 40 and the ground potential $V_{SS}$.

Figure 7:
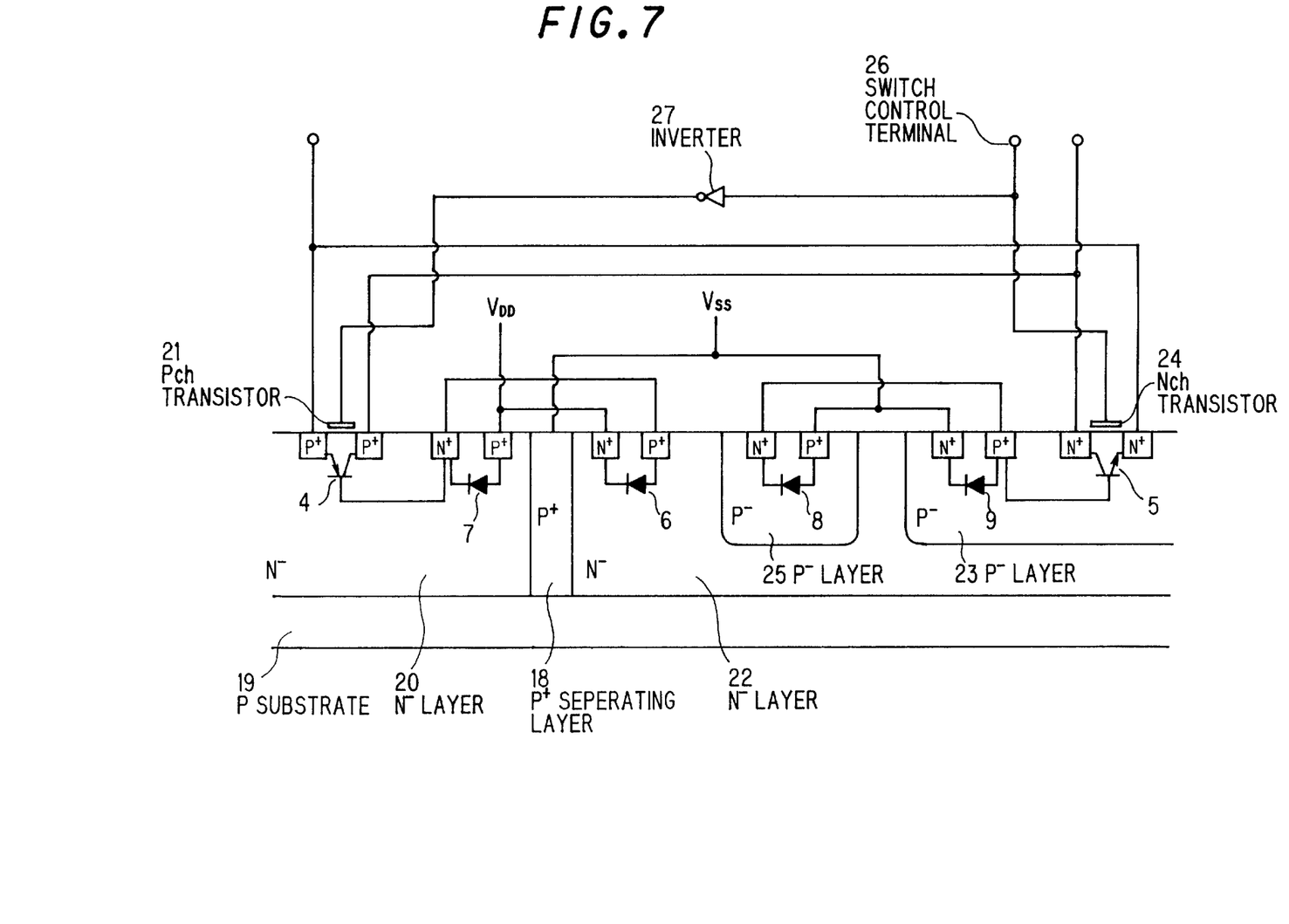
FIG. 7 is a cross sectional view showing the analog switch circuit in FIG. 6.

FIG. 7 is a cross sectional view showing the analog switch circuit in the first embodiment in FIG. 6. As shown in FIG. 6, $N^-$ layers 20, 22 separated by a $P^+$ separating layer 18 for preventing from latching up are formed on a P-substrate 19, the P-channel transistor 21 and the diode 7 are formed in the $N^-$ layer 20 and the diode 6 and $P^-$ layers 23, 25 are formed in the $N^-$ layer 22. Also, the N-channel transistor 24 and the diode 9 are formed in the $P^-$ layer 23 and the diode 8 is formed in the $P^-$ layer 25.

The switch control terminal 26 is connected through the inverter 27 to the gate electrode of the P-channel transistor 21 as well as being connected to the gate electrode of the N-channel transistor 24, and, as shown in FIG. 1A, it composes the analog switch 3 with the P-channel transistor 21 and the N-channel transistor 24 whose drains and sources are connected to each other.

Hereupon, formed is the parasitic PNP transistor 4 whose emitter, collector and base correspond to the source, drain and back gate, respectively, of the P-channel transistor 21, where the back gate, i.e., the base is connected to a power source potential $V_{DD}$. Also, formed is the parasitic PNP transistor 5 whose emitter, collector and base correspond to the source, drain and back gate, respectively, of the N-channel transistor 24, where the back gate, i.e., the base is connected to a ground potential $V_{DD}$. Thus, the analog switch 3 can be, as shown in FIG. 6, represented by the parasitic transistors 4 and 5.

The operation of the analog switch circuit in the embodiment will be explained below. First taken is the case that the potential of the input signal source 13 is higher than the potential $V_{DD}$ of the power source 12 and the potential of the input signal source 14 lies between the potential $V_{DD}$ of the power source 12 and the ground potential $V_{SS}$. Meanwhile, the input signal from the input signal source 14 is input to the comparator when the analog switch 3 in the control circuit 10 is turned off and the analog switch 28 in the control circuit 11 is turned on.

Figure 8:
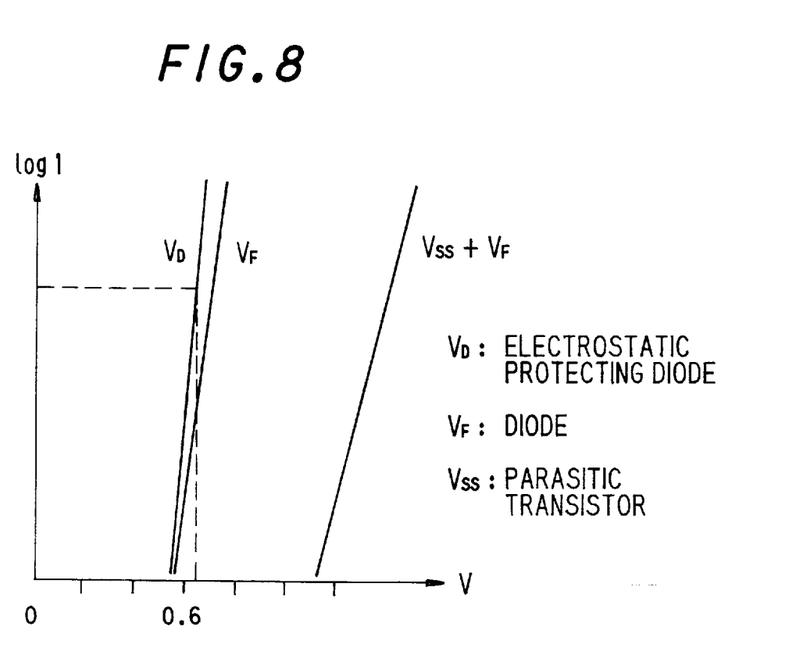
FIG. 8 is a diagram for explaining the operation of the analog switch circuit in the first embodiment.

In this case, the current flows from the input signal source 13 through the electrostatic protecting diode 1 into the power source 12. As shown in FIG. 8, the respective forward voltages $V_D$ of the electrostatic protecting diodes 1, 2 and the respective forward voltages $V_F$ of the diodes 6 to 9 are proportional to the logarithm of forward current I and are nearly 0.6 to 0.7 V in the above case that the current is limited by the current limiting resistance 15.

The forward voltage $V_D$ of the electrostatic protecting diode 1 is much lower than a voltage, which is (nearly 0.6 to 0.7) V×2 as shown by $(V_{BE}+V_F)$ in FIG. 8, required to flow the forward current through two diodes connected in series, i.e., the diode existing between the emitter and the base of the parasitic PNP transistor 4 of the analog switch 3 and the diode 6. Therefore, the current flowing from the input signal source 13 to the power source 12 is bypassed by the electrostatic protecting diode 1, thereby the parasitic PNP transistor 4 can not be operated. Accordingly, the potential of the input signal source 14 passing through the control circuit 11 is, as it is, normally applied to the input terminal of the comparator 17.

Next, in the case that the potential of the input signal source 13 is less than the ground potential $V_{SS}$, where the current flows from the ground potential $v_{SS}$ through the electrostatic protecting diode 2 and the current limiting resistance 15 into the input signal source 13, a series circuit which is composed of the diode 8 and the diode existing between the emitter and the base of the parasitic NPN transistor 5 of the analog switch 3 is formed parallel to the electrostatic protecting diode 2. Therefore, due to the similar reason to the above case, the current flowing from the ground potential $V_{SS}$ to the input signal source 13 is bypassed by the electrostatic protecting diode 2, thereby the parasitic NPN transistor 5 can not be operated. Accordingly, the potential of the input signal source 14 passing through the control circuit 11 is, as it is, normally applied to the input terminal of the comparator 17.

Though the above cases are under the conditions that the potential of the input signal source 13 is higher than the potential $V_{DD}$ of the power source 12 or less than the ground potential $V_{SS}$, as easily derived from the above explanation, the parasitic transistors in the analog switch 28 can also not be operated when the potential of the input signal source 13 lies between the potential $V_{DD}$ of the power source 12 and the ground potential $V_{DD}$ or when the potential of the input signal source 14 is higher than $V_{DD}$ or $V_{SS}$ when the input signal from the input signal source 13 is applied under the conditions that the analog switch 28 in the control circuit 11 is turned off and the analog switch 3 in the control circuit 10 is turned on.

In the integrated circuit which includes the analog switch circuit in the first embodiment, where the power source potential $V_{DD}$, ground potential $V_{SS}$ and power source 12 are directly connected, stable potentials $V_{DD}$ and $v_{SS}$ can be obtained. Thereby, the integrated circuit can be always normally operated and its reliability can be enhanced. Moreover, in the analog switch circuit in the first embodiment, the number of elements is (6n+4) to n input, which is much less than the number of elements in the conventional analog switch circuits, e.g., 14n or 9n to n input. Therefore, the integrated circuit employing the analog switch circuit in the embodiment can be miniaturized.

An analog switch circuit in the second preferred embodiment according to the invention will be explained in FIG. 9.

Figure 9:
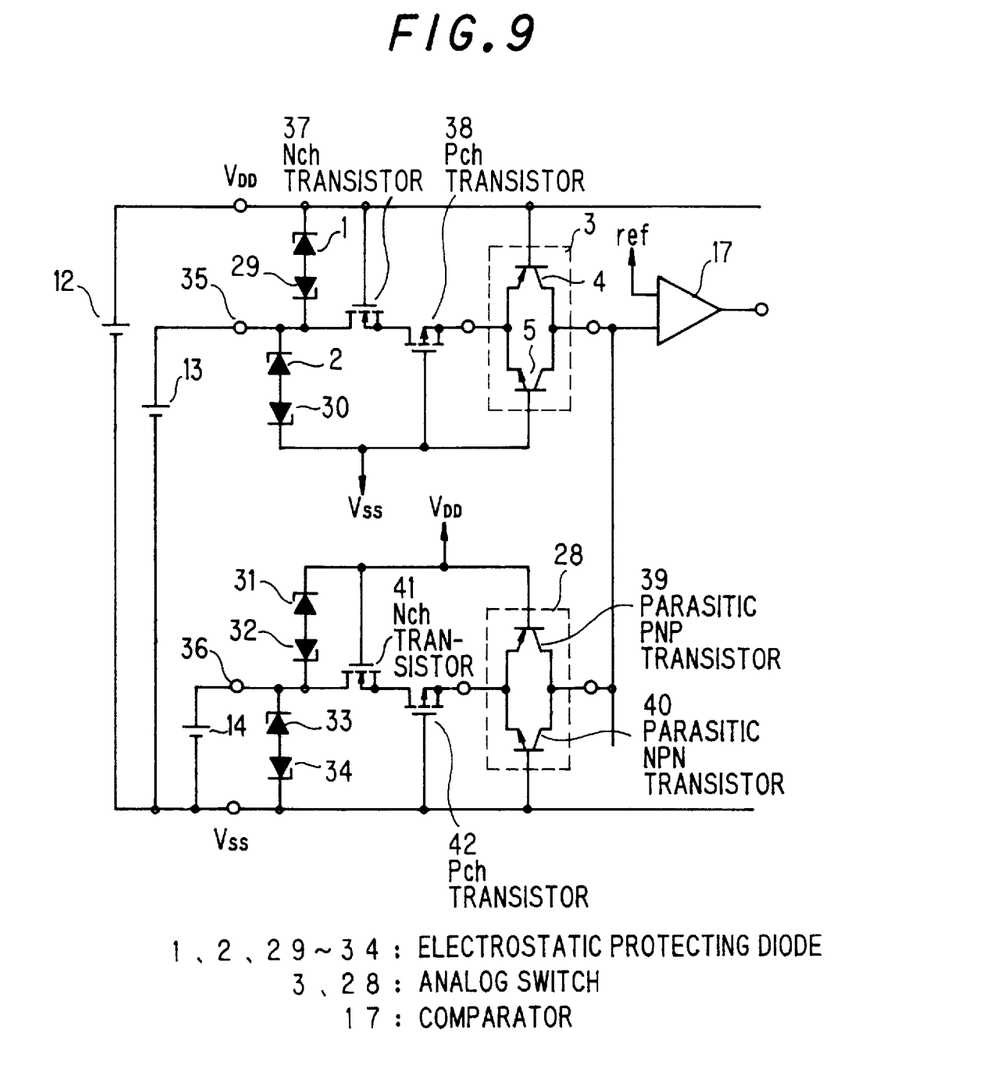
FIG. 9 is a circuit diagram showing an analog switch circuit in a second embodiment according to the invention.

As shown in FIG. 9, the analog switch circuit in the second embodiment comprises a power source 12, input signal sources 13, 14, electrostatic protecting diodes 1, 2 and 29 to 34, analog switches 3, 28, N-channel transistors 37, 41 and P-channel transistors 38, 42.

A series circuit composed of the electrostatic protecting diodes 1 and 29 which are reversely connected to each other is connected between an input terminal 35 connected to the positive terminal of the input signal source 13 and a power source potential $V_{DD}$, and a series circuit composed of the electrostatic protecting diodes 2, 30 which are reversely connected to each other is connected between the input terminal 35 and a ground potential $V_{SS}$. Similarly, a series circuit composed of the electrostatic protecting diodes 31 and 32 which are reversely connected to each other is connected between an input terminal 36 connected to the positive terminal of the input signal source 14 and the power source potential $V_{DD}$, and a series circuit composed of the electrostatic protecting diodes 33, 34 which are reversely connected to each other is connected between the input terminal 36 and the ground potential $V_{SS}$.

Also, the N-channel transistor 37 and the P-channel transistor 38 are in series connected between the input terminal 35 and the analog switch 3, and the N-channel transistor 41 and the P-channel transistor 42 are in series connected between the input terminal 36 and the analog switch 28. The respective gates of the N-channel transistors 37, 41 are connected to the power source potential $V_{DD}$, and the respective gates of the P-channel transistors 38, 42 are connected to the ground potential $v_{SS}$.

The analog switch 3 has a parasitic PNP transistor 4 and a parasitic NPN transistor 5, and the analog switch 28 has a parasitic PNP transistor 39 and a parasitic NPN transistor 40. The output terminals of the analog switches 3, 28 are commonly connected to the input terminal of a comparator 17.

Figure 10A:
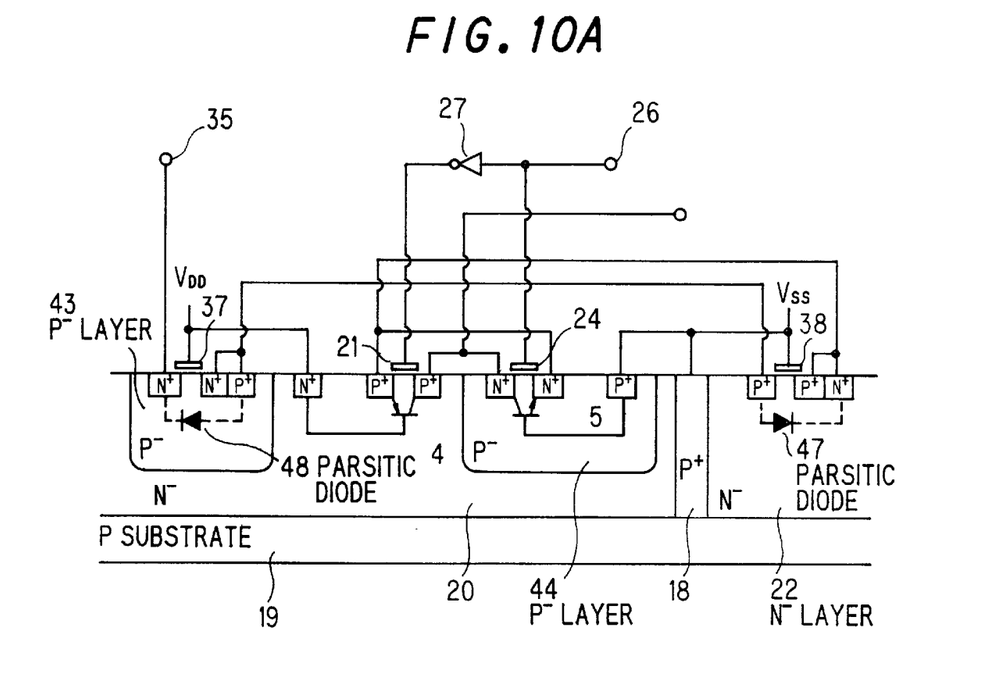
FIGS. 10A and 10B are cross sectional views showing the analog switch circuit in FIG. 9.
Figure 10B:
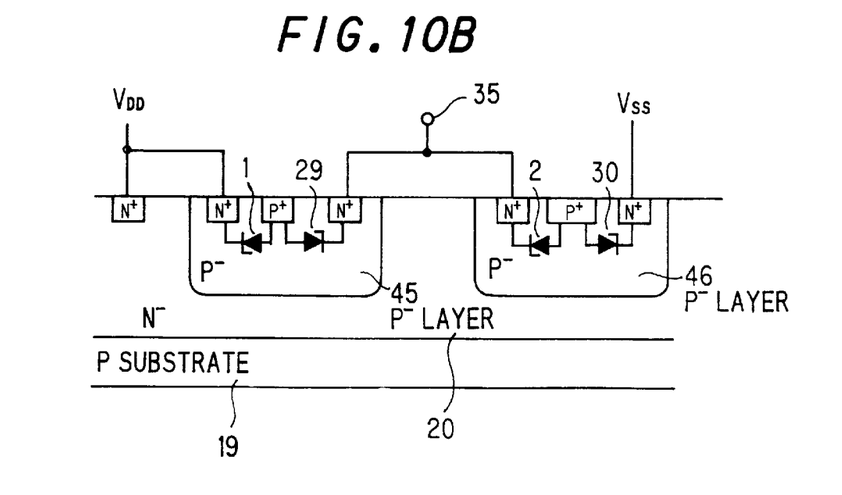

FIGS. 10A and 10B are cross sectional views showing the analog switch circuit in the second embodiment in FIG. 9. As shown in FIGS. 10A and 10B, N⁻ layers 20, 22 separated by a P⁺ separating layer 18 for preventing from latching up are formed on a P-substrate 19, a P-channel transistor 21 and P⁻ layers 43, 44, 45 and 46 are formed in the N⁻ layer 20 and the P-channel transistor 38 is formed in the N⁻ layer 22. Also, the N-channel transistor 37 is formed in the P⁻ layer 43 and a N-channel transistor 24 is formed in the P⁻ layer 44.

Furthermore, as shown in FIG. 10B, the electrostatic protecting diodes 1, 29 are formed in the P⁻ layer 45 in the N⁻ layer 20 and the electrostatic protecting diodes 2, 30 are formed in the P⁻ layer 46 in the N⁻ layer 20.

The switch control terminal 26 is connected through the inverter 27 to the gate electrode of the P-channel transistor 21 as well as being connected to the gate electrode of the N-channel transistor 24, and, as shown in FIG. 1A, it composes the analog switch 3 with the P-channel transistor 21 and the N-channel transistor 24 whose drains and sources are connected to each other.

Hereupon, formed is the parasitic PNP transistor 4 whose emitter, collector and base correspond to the source, drain and back gate, respectively, of the P-channel transistor 21, where the back gate, i.e., the base is connected to a power source potential $V_{DD}$. Also, formed is the parasitic PNP transistor 5 whose emitter, collector and base correspond to the source, drain and back gate, respectively, of the N-channel transistor 24, where the back gate, i.e., the base is connected to a ground potential $V_{SS}$. Thus, the analog switch 3 can be, as shown in FIG. 9, represented by the parasitic transistors 4 and 5.

Furthermore, as shown in FIG. 10A, formed is a parasitic diode 47 whose anode and cathode correspond to the drain and back gate, respectively, of the P-channel transistor 38, where the back gate, i.e., the cathode is connected to the respective emitters of the parasitic transistors 4, 5. Also formed is a parasitic diode 48 whose cathode and anode correspond to the drain and back gate, respectively, of the N-channel transistor 37, where the back gate, i.e., the anode is connected to the anode of the parasitic diode 47 and the cathode is connected to the input terminal 35.

The operation of the analog switch circuit in the second embodiment will be explained below. First taken is the case that the potentials of the input signal sources 13, 14 lie between the potential $V_{DD}$ of the power source 12 and the ground potential $V^{SS}$ and the analog switch 3 is turned off and the analog switch 28 is turned on. In this case, the N-channel transistors 37, 41 are turned on since the gates are connected to the power source potential $V_{DD}$ as the highest potential, and the P-channel transistors 38, 42 are turned on since the gates are connected to the ground potential $V_{SS}$ as the lowest potential. Thereby, the potentials of the input signal sources 13, 14 are, as it is, applied to the analog switches 3, 28. However, only the potential of the input signal source 14 is applied through the analog switch 28 to the comparator 17 since the analog switch 3 is turned off and the analog switch 28 is turned on, then compared with the reference voltage 'ref' therein.

Now, even if the source potential of the P-channel transistor 38, i.e., the input potential of the analog switch 3, is equal to the ground potential $V_{SS}$, the drain-source voltage of the P-channel transistor 38 is lower than about 0.6 V due to the parasitic diode 47 shown in FIG. 10A. Thereby, with the gate of the N-channel transistor 37 biased, the N-channel transistor 37 remains turned on. Therefore, the P-channel transistor 38 remains turned on since the source potential is biased to '(the potential of the input signal source 13)− (lower than about 0.6 V)'.

Also, even if the source potential of the P-channel transistor 38 is equal to the power source potential $V_{DD}$, the P-channel transistor 38 is turned on and the drain-source voltage of the P-channel transistor 37 is lower than about 0.6 V due to the parasitic diode 48 shown in FIG. 10A. Thereby, the electric charge accumulated in the source of the P-channel transistor 38, i.e., analog switch 3, is discharged toward the input signal source 13, and then the N-channel transistor 37 remains turned on since the source potential is '(the potential of the input signal source 13)+(lower than about 0.6 V)' and the gate-source voltage is biased to '(the power source potential $V_{DD}$)–[(the potential of the input signal source 13)+(lower than about 0.6 V)]'.

Next, the operation in the case that the potential of the input signal source 13 exceeds the potential $V_{DD}$ of the power source 12 will be explained. When the potential of the input signal source 13 shown in FIG. 9 is increased, the respective source potentials of the N-channel transistor 37 and the P-channel transistor 38 are increased with that. When '(the power source potential $V_{DD}$)–(the source potential of the N-channel transistor 37, i.e., the potential of the input signal source 13)' is lower than the threshold voltage $V_{THN}$ of the N-channel transistor 37, the N-channel transistor 37 is turned off. Even when it is higher than the potential $V_{DD}$ of the power source 12, the N-channel transistor 37 remains turned off. Further, since the electrostatic protecting diode 29 prevents the current from flowing into the electrostatic protecting diode 1, the current from the input signal source 13 stops flowing. Therefore, the current limiting resistance is not necessary.

Furthermore, the operation in the case that the potential of the input signal source 13 is lower than the ground potential $V_{SS}$ will be explained. When the potential of the input signal source 13 is lowered, the respective source potentials of the N-channel transistor 37 and the P-channel transistor 38 are lowered with that. When the source potential of the N-channel transistor 37, i.e., the potential of the input signal source 13 is lower than the threshold voltage $V_{THP}$ of the P-channel transistor 38, the N-channel transistor 38 is turned off. Even when it is lower than the ground potential $V_{SS}$, the P-channel transistor 38 remains turned off. Further, since the electrostatic protecting diode 30 prevents the current from flowing into the electrostatic protecting diode 2, the current from the input signal source 13 stops flowing. Therefore, the current limiting resistance is not necessary.

As described above, when the potential of the input signal source 13 is lower than the potential $V_{DD}$ of the power source 12, the N-channel transistor 37 operates, and, when the potential of the input signal source 13 is lower than the ground potential $V_{SS}$, the P-channel transistor 38 operates. Therefore, when the potential of the input signal source 13 is not decreased to be lower than the ground potential $V_{SS}$ and may exceed the power source potential $V_{DD}$ the P-channel transistor 38 is not necessary. On the other hand, when the potential of the input signal source 13 is not increased to be higher than the power source potential $V_{DD}$ and may be lower than the ground potential $V_{SS}$, the N-channel transistor 37 is not necessary.

In the second embodiment, the current limiting resistance is not necessary since the potential of the input signal source is not increased to be higher than the power source potential $V_{DD}$ of IC and is not decreased to be lower than the ground potential $V_{SS}$ of IC. Therefore, the heating due to the operation of the parasitic transistor can be prevented.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An analog switch circuit, comprising:

an analog switch which is composed of a P-channel first transistor and a N-channel second transistor whose drains are connected to each other and whose sources are connected to each other;

first and second diodes which are in parallel and reversely to each other connected between a back gate of said first transistor and a high-potential power source; and third and fourth diodes which are in parallel and reversely to each other connected between a back gate of said second transistor and a low-potential power source.

2. An analog switch circuit, according to claim 1, wherein:

said analog switch is provided corresponding to the number of input signal sources on a semiconductor integrated circuit substrate;

said analog switch circuit is further composed of a current limiting resistance disposed between said input signal source and an input terminal of said analog switch, first and second electrostatic protecting diodes disposed between said input terminal of said analog switch and said high-potential power source and between said input terminal of said analog switch and said low-potential power source, and a comparator whose input terminal is connected to an output terminal of said analog switch; and said first to fourth diodes are commonly provided for the number of said analog switches equal to the number of said input signal sources.

3. An analog switch circuit, comprising:

an analog switch which is composed of a P-channel first transistor and a N-channel second transistor whose drains are connected to each other and whose sources are connected to each other; and a N-channel third transistor whose gate is connected to a high-potential power source and/or a P-channel fourth transistor whose gate is connected to a low-potential power source;

wherein said third transistor and/or said fourth transistor are/is in series connected between an input terminal and an input terminal of said analog switch.

4. An analog switch circuit, according to claim 3, wherein:

said analog switch is provided corresponding to the number of input signal sources on a semiconductor integrated circuit substrate; and said analog switch circuit is further composed of first and second electrostatic protecting diodes which are in series and reversely to each other connected between said input terminal of said input signal source and said high-potential power source, third and fourth diodes which are in series and reversely to each other connected between said input terminal of said input signal source and said low-potential power source, and a comparator whose input terminal is connected to an output terminal of said analog switch.

* * * * *

UNITED STATES PATENT AND TRADEMARK OFFICE
CERTIFICATE OF CORRECTION

PATENT NO. : 5,880,621
DATED : March 9, 1999
INVENTOR(S) : Ikuo OHASHI

It is certified that error appears in the above-identified patent and that said Letters Patent is hereby corrected as shown below:

Column 6, line 17, delete "$V_{oo}$" and insert --$V_{ss}$--.

Signed and Sealed this

Tenth Day of August, 1999

Attest:

Q. TODD DICKINSON

*Attesting Officer*       *Acting Commissioner of Patents and Trademarks*